United States Patent
Denis et al.

(10) Patent No.: US 12,442,510 B2
(45) Date of Patent: Oct. 14, 2025

(54) PHOSPHOR-CONVERTED LIGHT EMITTING DIODES (LEDs) COLOR TUNING

(71) Applicant: Lumileds LLC, San Jose, CA (US)

(72) Inventors: Gregoire Denis, Sunnyvale, CA (US); Rohit Modi, Hayward, CA (US)

(73) Assignee: LUMILEDS SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 18/833,693

(22) PCT Filed: Jan. 16, 2023

(86) PCT No.: PCT/US2023/010852
§ 371 (c)(1),
(2) Date: Jul. 26, 2024

(87) PCT Pub. No.: WO2023/146765
PCT Pub. Date: Aug. 3, 2023

(65) Prior Publication Data
US 2025/0243990 A1 Jul. 31, 2025

Related U.S. Application Data

(60) Provisional application No. 63/304,025, filed on Jan. 28, 2022.

(51) Int. Cl.
*F21V 9/38* (2018.01)
(52) U.S. Cl.
CPC .................. *F21V 9/38* (2018.02)
(58) Field of Classification Search
CPC ..... F21V 9/30; F21V 9/35; F21V 9/38; F21Y 2115/00; F21Y 2115/10; F21Y 2115/15;
(Continued)

(56) References Cited

U.S. PATENT DOCUMENTS

| 6,650,044 B1 | 11/2003 | Lowery |
| 8,203,161 B2 | 6/2012 | Simonian et al. |

(Continued)

FOREIGN PATENT DOCUMENTS

| JP | 2019208069 A | 12/2019 |
| KR | 20100091169 A | 8/2010 |

(Continued)

OTHER PUBLICATIONS

PCT International Search Report and Written Opinion in PCT/US2023/010852 dated May 19, 2023, 9 pages.
(Continued)

*Primary Examiner* — Robert J May
(74) *Attorney, Agent, or Firm* — SERVILLA WHITNEY LLC

(57) ABSTRACT

Light sources including pluralities of light emitting diodes (LEDs) comprise primary and laser-modified device materials in order to achieve tuned color point distributions. The device materials may be down converter materials and/or functional materials. Tuned color point distributions include improved color yields by modifying sections of the device material of the LEDs that skew a baseline color point distribution. Other tuned color point distributions provide a centroid of a tuned color distribution relative to a centroid of a baseline color distribution by modifications to sections of the device material. Modifications to the device material may be conducted by femtosecond laser irradiation. Modifications to down converter materials may include ablation for thickness reduction and/or roughening for a surface topography change and/or three-dimensional shaping for light emission tunability. Modifications to functional materials may include ablation for thickness reduction.

18 Claims, 9 Drawing Sheets

(58) Field of Classification Search
CPC .............. F21Y 2115/20; F21Y 2115/30; H10H 20/851; H10H 20/8511; H10H 20/8512; H10H 20/8513; H10H 20/8514; H10H 20/8515; H10H 20/8516

See application file for complete search history.

(56) References Cited

U.S. PATENT DOCUMENTS

| | | |
|---|---|---|
| 8,772,814 B2 | 7/2014 | Ray et al. |
| 9,117,979 B2 | 8/2015 | Matsumura et al. |
| 2002/0171911 A1 | 11/2002 | Maegawa |
| 2006/0258028 A1 | 11/2006 | Paolini et al. |
| 2008/0173884 A1 | 7/2008 | Chitnis et al. |
| 2009/0014736 A1 | 1/2009 | Ibbetson et al. |
| 2009/0261358 A1 | 10/2009 | Chitnis et al. |
| 2010/0012964 A1 | 1/2010 | Copic et al. |
| 2011/0121331 A1 | 5/2011 | Simonian et al. |
| 2013/0070443 A1 | 3/2013 | Pan et al. |
| 2014/0008690 A1 | 1/2014 | Funayama et al. |
| 2020/0098950 A1 | 3/2020 | Basin et al. |
| 2021/0189043 A1 | 6/2021 | Horigome et al. |
| 2021/0328112 A1 | 10/2021 | Mcfarlane et al. |

FOREIGN PATENT DOCUMENTS

| | | |
|---|---|---|
| KR | 20110079903 A | 7/2011 |
| KR | 20190085746 A | 7/2019 |
| KR | 20190099319 A | 8/2019 |
| WO | 2012019081 A2 | 2/2012 |

OTHER PUBLICATIONS

PCT International Search Report and Written Opinion in PCT/US2023/010853 dated May 15, 2023, 12 pages.

PCT International Search Report and Written Opinion in PCT/US2023/010854 dated May 10, 2023, 11 pages.

BASELINE

BASELINE

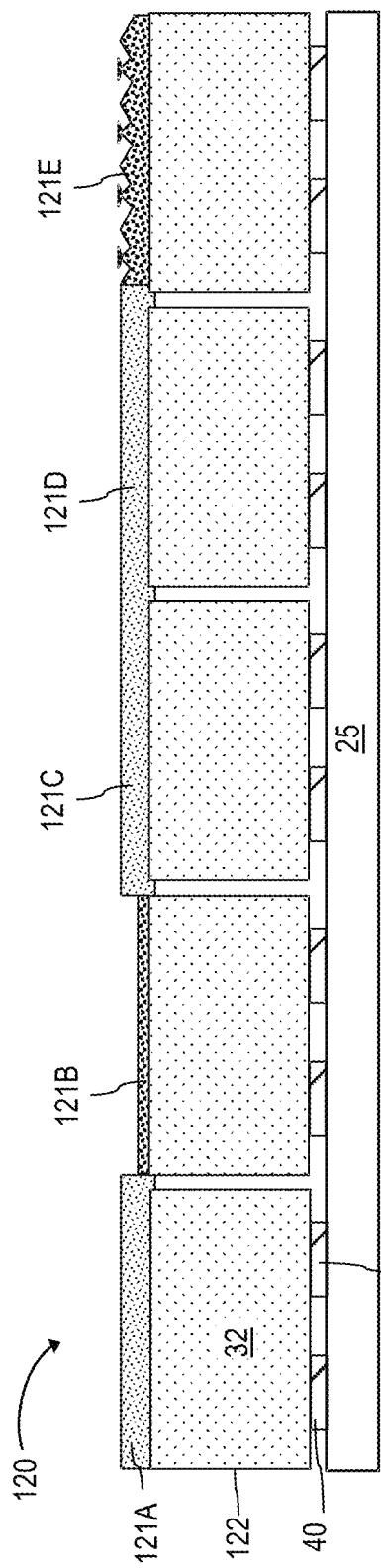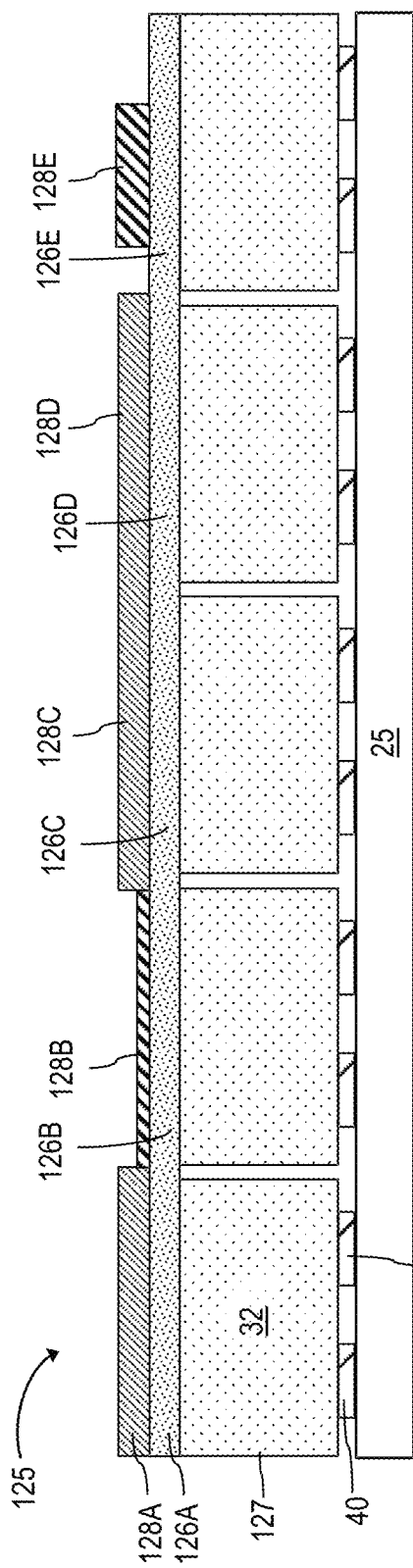

PHOSPHOR-CONVERTED LIGHT EMITTING DIODES (LEDs) COLOR TUNING

CROSS-REFERENCE TO RELATED APPLICATIONS

This application is a National Phase entry of United States PCT Application No. PCT/US2023/010852, filed Jan. 16, 2023, which claims priority to U.S. Provisional Patent Application No. 63/304,025, filed Jan. 28, 2022, the disclosures of which are incorporated herein by reference in their entireties.

TECHNICAL FIELD

Embodiments of the disclosure generally relate to light sources including light emitting diodes (LEDs) and methods of manufacturing the same. More particularly, embodiments are directed to light sources comprising one or more light emitters including device material, for example down converter material and/or functional material, where there is primary device material and laser-modified device material. Primary device material, for example, primary down converter material and/or primary functional material, is laser-treated to prepare laser-modified device material, for example, laser-modified down converter material and/or laser-modified functional material. The light source comprises a tuned color point distribution as a whole. The tuned color point distribution may be a tuned a spectrum characteristic of v' versus u' and/or a tuned correlated color temperature.

BACKGROUND

Semiconductor light-emitting devices or optical power emitting devices (such as devices that emit ultraviolet (UV) or infrared (IR) optical power), including light emitting diodes, resonant cavity light emitting diodes, vertical cavity laser diodes, and edge emitting lasers, are among the most efficient light sources currently available. Due to their compact size and lower power requirements, for example, semiconductor light or optical power emitting devices (referred to herein as LEDs for simplicity) are attractive candidates for light sources, such as camera flashes, for hand-held battery-powered devices, such as cameras and cell phones. They may also be used, for example, for other applications, such as for automotive lighting, torch for video, and general illumination, such as home, shop, office and studio lighting, theater/stage lighting and architectural lighting.

High-intensity/brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a growth substrate such as a sapphire, silicon carbide, III-nitride, or other suitable substrate by metal-organic chemical vapor deposition (MOCVD), molecular beam epitaxy (MBE), or other epitaxial techniques. Sapphire is often used as the growth substrate due to its wide commercial availability and relative ease of use. The stack grown on the growth substrate typically includes one or more n-type layers doped with, for example, Si, formed over the substrate, a light emitting or active region formed over the n-type layer or layers, and one or more p-type layers doped with, for example, Mg, formed over the active region.

Phosphor converted LEDs (pc-LEDs) include a phosphor layer on an LED pump or die. The phosphor layer absorbs energy and converts an entering wavelength to a lower-energy wavelength. For example, the phosphor layer down-converts high energy LED light into a more desirable color spectrum. In practice, the phosphor layer composition and structure is chosen to meet desired performance criteria. LED color accuracy and distribution impacts both color and flux utilization.

Accurate color point is an attribute of pc-LEDs. In the LED industry, the color space is divided into narrow color bins, such as MacAdam Ellipses for illumination, or H color bins in automotive front lighting. CIE 1931 and CIE 1976 chromaticity diagrams, for example, define color bins. CIE 1931 uses coordinates (x,y) and CIE 1976 uses coordinates (u', v'). When light sources are governed by specific color bins, only LED-based devices within a specified color bin are usable.

Color spatial distribution is another topic for LED manufacturers. LED light is typically projected via a secondary optic, thereby imaging the color distribution from the LED source onto the projection plan. Any inhomogeneity in the color distribution of the LED light source will therefore appear as different colors on the projected images. This problem accrues in micro-LEDs where the small size of the pixels makes it difficult to maintain pixel-to-pixel color uniformity.

Improvement of LED and micro-LED color accuracy and distribution is therefore an ongoing goal for LED manufacturers due to their impacts on both color and flux utilization.

SUMMARY

Provided herein are light sources and methods of making them.

In an aspect, a light source comprises: a plurality of light emitting diodes (LEDs); a plurality of sections of a primary down converter material corresponding to a first plurality of the LEDs; and one or more sections of a laser-modified down converter material corresponding to a second plurality of the LEDs; a light blocking layer positioned between all of the LEDs; and a tuned color point distribution of the light source as a whole.

Another aspect provides a light source comprising: a monolithic body comprising: a plurality of micro-light emitting diodes (uLEDs) having at least one characteristic dimension of greater than or equal to 1 micrometer less than or equal to 300 micrometers, the characteristic dimension being selected from the group consisting of: height, width, depth, thickness, and combinations thereof; a continuous down converter layer on all of the uLEDs comprising a plurality of sections of a primary down converter material corresponding to a first plurality of the uLEDs, and one or more sections of a laser-modified down converter material corresponding to a second plurality of the uLEDs, the one or more sections of the laser-modified down converter material comprising relative to the primary down converter material: a thickness reduction and/or a surface topography change and/or three-dimensional shaping; a light blocking layer positioned between all of the uLEDs; and a tuned color point distribution of the light source as a whole.

In an further aspect, a method of manufacturing a light source comprising a plurality of light emitters comprises: measuring a baseline color point distribution of a baseline light source comprising a plurality of light emitting diodes (LEDs), and a primary down converter material in the absence of any laser-modified down converter material; preparing a baseline color point distribution graph; identifying one or more sections of the primary down converter material whose corresponding LEDs contribute to deviating from a tuned color point distribution; applying a laser treatment to the one or more sections of the primary down converter material whose corresponding LEDs contribute to deviating from the tuned color point distribution to prepare one or more sections of a laser-modified down converter material, and thereby prepare a light source having the tuned color point distribution.

Another aspect is a light source comprising: one or more light emitting diodes (LEDs); a primary down converter material on the one or more LEDs; and a roughened down converter material on the one or more LEDs;

A further aspect is a method of manufacturing a light source comprising: measuring a baseline color point distribution of a baseline light source comprising one or more light emitting diodes (LEDs), and a primary down converter material in the absence of any laser-modified down converter material; preparing a baseline color point distribution graph; identifying one or more sections of the primary down converter material whose corresponding LEDs contribute to deviating from a tuned color point distribution; applying a roughening laser treatment to the one or more sections of the primary down converter material whose corresponding LED or LEDs contribute to deviating from the tuned color point distribution to prepare one or more sections of roughened down converter material, and thereby prepare a light source having the tuned color point distribution.

In further aspect, a light source comprises: one or more light emitting diodes (LEDs) separated by a light blocking layer; a down converter material on the one or more LEDs; and a functional material that is laser-patterned on the down converter material.

Other aspects provide: light sources comprising: one or more light emitting diodes (LEDs); a phosphor material comprising a polycrystalline ceramic plate off-set on the one or more LEDs; and a functional material that is laser-patterned on the phosphor material.

Further methods of manufacturing light sources comprises: patterning a functional material of a light source comprising one or more light emitting diodes and a phosphor material.

In an aspect, a light source comprises: a plurality of light emitting diodes (LEDs); a down converter material on the LEDs; a plurality of sections of a primary functional material corresponding to a first plurality of the LEDs; one or more sections of an ablated functional material corresponding to a second plurality of the LEDs; a light blocking layer positioned between all of the LEDs; and a tuned color point distribution of the light source as a whole.

Another aspect provides a method of manufacturing a light source comprising a plurality of light emitters, the method comprising: measuring a baseline color point distribution of a baseline light source comprising a plurality of light emitting diodes (LEDs), a down converter material, and a primary functional material in the absence of any laser-modified functional material; preparing a baseline color point distribution graph; identifying one or more sections of the primary functional material whose corresponding LEDs contribute to deviating from a tuned color point distribution; and applying a laser treatment to the one or more sections of the primary functional material whose corresponding LEDs contribute to deviating from the tuned color point distribution to prepare one or more sections of a laser-modified functional material, and thereby prepare a light source having the tuned color point distribution.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements. The schematic figures herein are not to scale.

FIG. 10 is a schematic cross-sectional view of a light source comprising an array of micro-light emitting diodes (uLEDs) on a device substrate including primary and laser-modified down converter material in accordance with one or more embodiments;

FIG. 11 is a schematic cross-sectional view of a light source comprising an array of micro-light emitting diodes (uLEDs) on a device substrate including primary and laser-modified functional material according to one or more embodiments;

DETAILED DESCRIPTION

Figure 1:
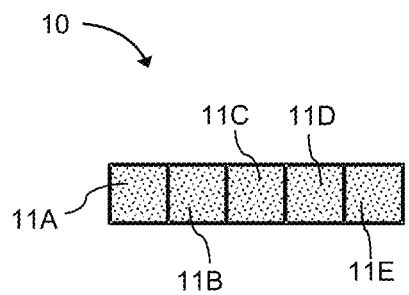
FIG. 1 shows a schematic top view of a baseline (or comparative) light source (unmodified)

Before describing several exemplary embodiments of the disclosure, it is to be understood that the disclosure is not limited to the details of construction or process steps set forth in the following description. The disclosure is capable of other embodiments and of being practiced or being carried out in various ways.

The term "substrate" as used herein according to one or more embodiments refers to a structure, intermediate or final, having a surface, or portion of a surface, upon which a process acts. In addition, reference to a substrate in some embodiments also refers to only a portion of the substrate, unless the context clearly indicates otherwise. Further, reference to depositing on a substrate according to some embodiments includes depositing on a bare substrate, or on a substrate with one or more films or features or materials deposited or formed thereon.

In one or more embodiments, the "substrate" means any substrate or material surface formed on a substrate upon which film processing is performed during a fabrication process. A "growth substrate" or "LED substrate" is a substrate on which epitaxial layers including one or more active layers are prepared or grown. A "device substrate" is a substrate of a final product or device. In some embodiments, a growth substrate is removed and no additional substrate is included. In some embodiments, a growth substrate is removed and a device substrate is affixed. In some embodiments, an "LED substrate" is included in an LED pump that is affixed a device substrate. In exemplary embodiments, a substrate surface on which processing is performed includes materials such as silicon, silicon oxide, silicon on insulator (SOI), strained silicon, amorphous silicon, doped silicon, carbon doped silicon oxides, germanium, gallium arsenide, glass, sapphire, and any other suitable materials such as metals, metal nitrides, III-nitrides (e.g., GaN, AlN, InN and alloys), metal alloys, and other conductive materials, depending on the application. Substrates include, without limitation, light emitting diode (LED) devices, including uLED devices. Substrates in some embodiments are exposed to a pretreatment process to polish, etch, reduce, oxidize, hydroxylate, anneal, UV cure, e-beam cure and/or bake the substrate surface. In addition to film processing directly on the surface of the substrate itself, in some embodiments, any of the film processing steps disclosed are also performed on an underlayer formed on the substrate, and the term "substrate surface" is intended to include such underlayer as the context indicates. Thus for example, where a film/layer or partial film/layer has been deposited onto a substrate surface, the exposed surface of the newly deposited film/layer becomes the substrate surface.

Reference to LED refers to a light emitting diode that emits light when current flows through it. In one or more embodiments, the LEDs herein have one or more characteristic dimensions (e.g., height, width, depth, thickness, etc. dimensions) in a range of greater than or equal to 75 micrometers to less than or equal to 300 micrometers. In one or embodiments, one or more dimensions of height, width, depth, thickness have values in a range of 100 to 300 micrometers. Reference herein to micrometers allows for variation of ±1-5%. In a preferred embodiment, one or more dimensions of height, width, depth, thickness have values of 200 micrometers ±1-5%. In some instances, the LEDs are referred to as micro-LEDs (uLEDs or µLEDs), referring to a light emitting diode having one or more characteristic dimensions (e.g., height, width, depth, thickness, etc. dimensions) on the order of micrometers or tens of micrometers. In one or embodiments, one or more dimensions of height, width, depth, thickness have values in a range of 1 to less than 75 micrometers, for example from 1 to 50 micrometers, or from 1 to 25 micrometers. Overall, in one or more embodiments, the LEDs herein may have a characteristic dimension ranging from 1 micrometers to 300 micrometers, and all values and sub-ranges therebetween.

Methods of depositing materials, layers, and thin films include but are not limited to: sputter deposition, atomic layer deposition (ALD), chemical vapor deposition (CVD), physical vapor deposition (PVD), plasma enhanced atomic layer deposition (PEALD), plasma enhanced chemical vapor deposition (PECVD), and combinations thereof.

Methods of forming or growing semiconductor layers including N-type layer, active region, and P-type layer are formed according to methods known in the art. In one or more embodiments, the semiconductor layers are formed by epitaxial (EPI) growth. The semiconductor layers according to one or more embodiments comprise epitaxial layers, III-nitride layers, or epitaxial III-nitride layers. In one or more embodiments, the semiconductor layers comprise a III-nitride material, and in specific embodiments epitaxial III-nitride material. In some embodiments, the III-nitride material comprises one or more of gallium (Ga), aluminum (Al), and indium (In). Thus, in some embodiments, the semiconductor layers comprises one or more of gallium nitride (GaN), aluminum nitride (AlN), indium nitride (InN), aluminum gallium nitride (AlGaN), indium gallium nitride (InGaN), indium aluminum nitride (InAlN), aluminum indium gallium nitride (AlInGaN) and the like. The III-nitride materials may be doped with one or more of silicon (Si), oxygen (O), boron (B), phosphorus (P), germanium (Ge), manganese (Mn), or magnesium (Mg) depending upon whether p-type or n-type III-nitride material is needed. In one or more embodiments, the semiconductor layers have a combined thickness in a range of from about 2 µm to about 10 µm, and all values and subranges therebetween.

Down converter materials or layers, e.g., phosphor-based material or layers, absorb energy, converting an entering wavelength to a lower-energy higher wavelength. In one or more embodiments, the down converter material comprises a ceramic phosphor material or layer. Other down-converter materials may be phosphor particles and/or semiconductor nanoparticles (quantum dots), which may be used in combination with a binder to prepare a down converter layer.

In one or more embodiments, the down converter material is a Lumiramic® plate and/or phosphor powder embedded in a transparent matrix material. The Lumiramic plate is a polycrystalline ceramic plate of a phosphor material. The Lumiramic plate may be made from a Ce(III)-doped garnet material $((M^I_{1-x-y}M^{II}_xM^{III}_y)_3(Al_{1-z}M^{IV}_z)_5O_{12}$ with $M^I$=(Y, Lu); $M^{II}$=(Gd, La, Yb); $M^{III}$=(Tb, Pr, Ce, Er, Nd, Eu) and $M^{IV}$=(Gd, Sc) with 0<x<1; 0<y≤1; and 0<z<1), or a Ce(III) and/or Eu(II) doped nitridosilicate $(M_2Si_5N_8)$, or an oxonitridosilicate material $(MSi_2O_2N_2)$ (M=alkaline earth)).

In one or more embodiments, advantageously a Lumiramic plate is combined with a blue light emitting LED die to produce white light in the range of 5000-7000 K correlated color temperature (CCT).

Light sources including pluralities of light emitting diodes (LEDs) comprise primary and laser-modified device materials in order to achieve tuned color point distributions. The device materials may be down converter materials and/or functional materials. Tuned color point distributions include improved color yields by modifying sections of the device material of the LEDs that skew a baseline color point distribution. Other tuned color point distributions provide a new correlated color temperature relative to a baseline correlated color temperature by modifications to sections of the device material. Modifications to the device material may be conducted by femtosecond laser irradiation. Modifications may include ablation for thickness reduction and/or roughening for a surface topography change and/or three-dimensional shaping for light emission tunability.

A "tuned" color point distribution refers to a light characteristic that has been achieved relative to a baseline color point distribution upon modification of a baseline light source. The baseline light source includes multiple pixels and/or LEDs and no laser-modified materials. In one or more embodiments, the tuned color point distribution has a lower standard deviation as compared to a baseline color point distribution of a baseline light source. In one or more embodiments, a centroid of a tuned color point distribution (e.g., "tuned centroid") differs from a centroid of a baseline color distribution (e.g., (baseline centroid") of a baseline light source. For some illustration purposes, reference is made to CIE 1976 color space, which is defined by (u', v') coordinates. Such analysis could analogously be applied to CIE 1931 color space, which is defined by (x, y) coordinates, or any other defined color space. Herein, various embodiments are shown using five pixels and/or LEDs. Devices and techniques herein apply to any plurality of LEDs or pixels in any amount and in any array configuration.

In one or more embodiments, a blue light emitting LED dies or pumps are used in conjunction with a down converter material, such as a Lumiramic plate to produce white light. Devices herein advantageously meet one or more particular automotive bins for automotive front lighting. In one or more embodiments, as an example, any light source herein is effective to meet a first region in CIE 1931 color space, the first region being a polygon with (x, y) vertices of (0.31, 0.348), (0.453, 0.44), (0.5,0.44), (0.5, 0.38), (0.44, 0.38), and (0.31, 0.283).

Figure 2:
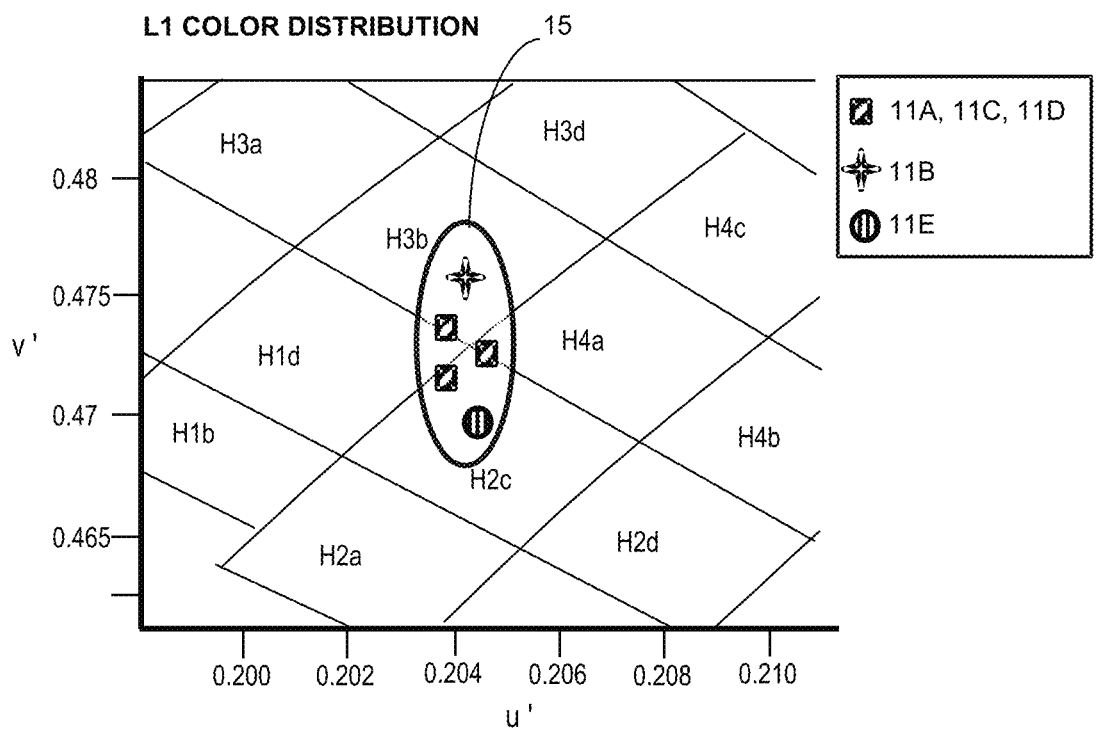
FIG. 2 provides an illustrative graph of color points for the pixels of the light source collectively presenting a color point distribution of FIG. 1 depicted for automotive color bins in a CIE 1976 color space.

A device including a plurality of LEDs or pixels in the absence of any laser modification is shown in FIG. 1, which is a schematic top view of a baseline light source 10. A plurality of pixels 11A, 11B, 11C, 11D, and 11E is shown. The use of 5 pixels is for illustrative purposes only. All of the pixels 11A-11E include a primary device material, e.g., a down converter material, in its as-prepared form. No laser modification has been applied. FIG. 2 provides an illustrative graph of color points for the pixels of the light source collectively presenting a color point distribution 15 of the light source of FIG. 1 depicted for automotive color bins in a CIE 1976 color space. FIG. 2 is an exemplary baseline color point distribution of a multi-pixeled light source.

For illustrative purposes, the L1 color distribution along v' axis of the baseline light source is shown as 2.7 points standard deviation (schematized by oval "2-A" in FIG. 2). Such spread is wider than color sub-bins used in automotive application (H3b, H2c, H4a, etc.), which can impede optimal yields and performance in manufacturing. Upon review of FIG. 2, pixels 11B and 11E are identified as being outliers that skew the color point distribution. Pixel 11B is a generator of the highest quantile of the baseline color point distribution. Pixel 11E is a generator of the lowest quantile of the baseline color point distribution.

Techniques herein facilitate tuning color point of a phosphor-converted LED (pc-LED) after a device material such as a down material, e.g., a phosphor layer, or a functional material has already been applied. The device material is assessable by a laser for processing.

Advantageously, more accurate control of LED color point and/or an increase of color uniformity are achieved, including from device-to-device, or pixel-to-pixel within one LED. Some of the advantages are: (i) an increase of color yields, (ii) an increase of overall flux distribution without color yield loss, (iii) enabling tighter specifications on LED color, and (iv) improving color over source metric. Functional materials can include one or more of the following: a distributed Bragg reflector (DBR), a dichroic filter (DCF), a ceramic material, and a powdered phosphor layer.

Figure 3:
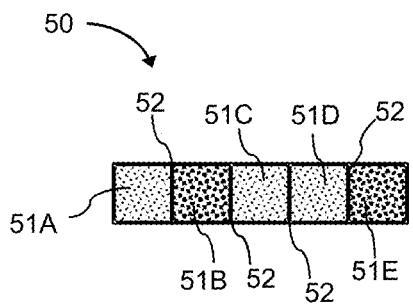
FIG. 3 shows a schematic top view of a light source in accordance with one or more embodiments.
Figure 4:
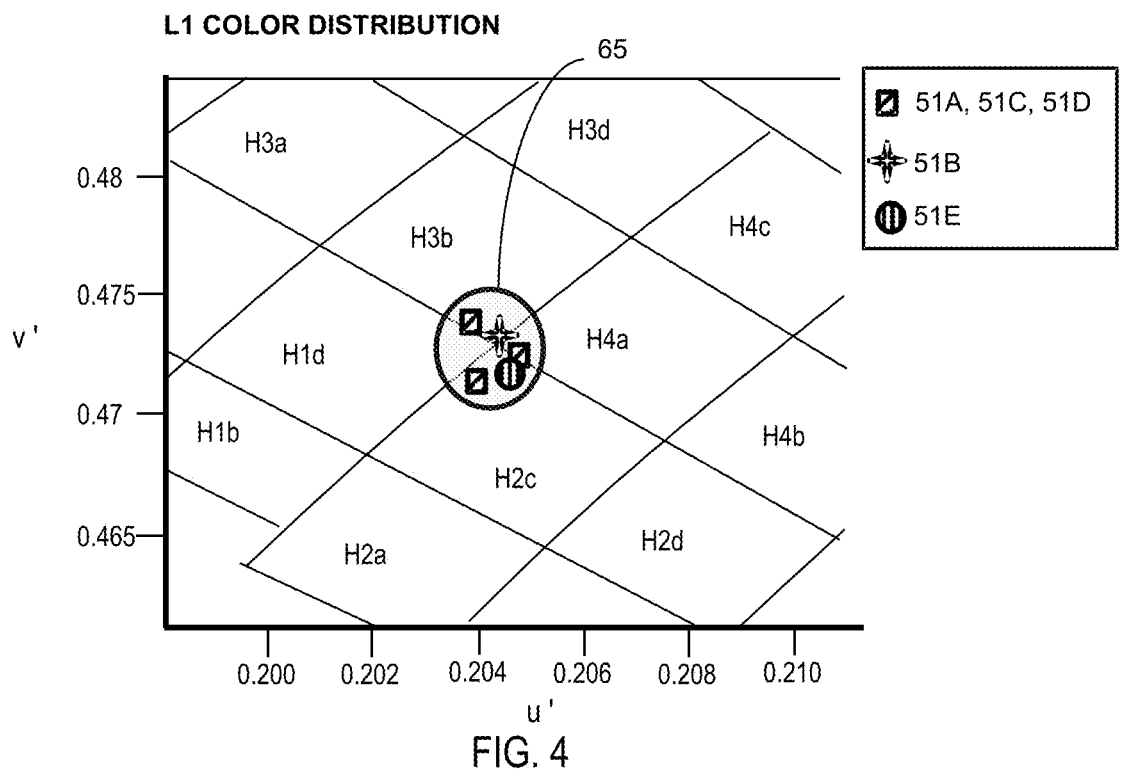
FIG. 4 provides an illustrative graph of color points for the pixels of the light source collectively presenting a color point distribution of FIG. 3 for automotive color bins in a CIE 1976 color space in accordance with one or more embodiments.

Turning to FIG. 3, a schematic top view of a light source 50 in accordance with one or more embodiments is provided. A plurality of pixels 51A, 51B, 51C, 51D, and 51E is shown. A light blocking layer 52 is positioned between all of the pixels 51A, 51B, 51C, 51D, and 51E. The use of 5 pixels is again for illustrative purposes only. In light of pixels 11B and 11E of FIG. 1 being identified as highest and/or lowest quantiles of the baseline color point distribution, laser treatment is applied to these pixels, which correspond to pixels 51B and 51E in lights source 50. Pixels 51A, 51C, and 51D are not laser-modified. FIG. 4 provides an illustrative graph of color points for the pixels of the light source collectively presenting a color point distribution 65 of the light source of FIG. 3 for automotive color bins in a CIE 1976 color space in accordance with one or more embodiments. It is seen in FIG. 4 that the resulting L1 color distribution along v' axis of the inventive light source is lower (schematized by circle "4-A" in FIG. 4) than that of FIG. 2. Accordingly, in one or more embodiments, the tuned color point distribution has a lower standard deviation compared to the baseline color point distribution.

In some embodiments, with respect to centroid of a baseline color distribution, a centroid of a tuned color point distribution of laser-modified devices will differs from that of the baseline color distribution.

Embodiments herein involve the following two features: a phosphor-converted LED (pc-LED) on a baseline color point had been measured at a pixel level (FIG. 2); and use of a laser to ablate or change the roughness topography of a phosphor-layer and/or a functional layer to modify its light conversion properties (e.g., FIG. 4). Upon measurement of the baseline color point, a baseline color point distribution graph is prepared.

In one or more embodiments, for color tuning, an incoming pc-LED device has its baseline color point distribution measured (e.g., FIG. 2). The pc-LEDs, or pixels, causing the highest and lowest quantiles of the color point distribution are identified (e.g., pixels 11B and 11E of FIG. 1). A surface treatment, e.g., a laser treatment using a femtosecond laser, is then applied to irradiate the surface of the phosphor-layer of the identified LEDs to yield laser-modified materials (e.g., pixels 51B and 51E of FIG. 3). The irradiation can be done either in ablation mode (to decrease v') or in roughening mode (to increase v'). Femtosecond laser irradiation has a sufficient spatial resolution (micrometer scale) and irradiance control to tune color point within the needed accuracy. The laser irradiation is therefore done such that after irradiation the color point of the highest and lowest quantiles pc-LEDs/pixels are brought back closer to the median (FIG. 4). This results in a reduction of the overall color distribution.

The color point of a pc-LED changes as the amount of primary light conversion by the phosphor layer increases (v' increase) or decreases (v' decrease). The ablation mode of femtosecond laser irradiation enables removal of material while keeping surface topology the same. Reduction of down converter material, such as phosphor material, results in a reduction of primary light conversion (v' decrease). The roughening mode of femtosecond laser irradiation mostly changes the surface topology of the phosphor layer, which results in an increase of scattering at the surface of the phosphor layer and therefore of additional passes of the primary light within the phosphor layer. This is comparable to an increase of the "effective" thickness of the phosphor layer and hence an increase of the primary light conversion (v' increase). Overall color point could be either increased or decreased (center graph) depending on the mode used. Three-dimensional shaping may also be applied for light emission tunability. Topology scans of surfaces will indicate whether such modifications have been applied.

Advantageously, tuned color point distribution of a light source as a whole by use of laser treatment can facilitate preparing a flux advantageous color point without color yield loss. This results from achieving a desired centroid of a tuned color distribution. Techniques herein also present ease of color targeting in production environment. That is, after a group of pc-LEDs is made, further laser processing can allow for tuning specific phosphor layer production runs. Utilization of pc-LEDs is improved by providing ways to bring more pc-LEDs into compliance with specified color sub-bins. Laser beam size is small enough that it could be applied on micro-LEDs and rectify color points of outlier pixels.

Figures 5A, 5B:
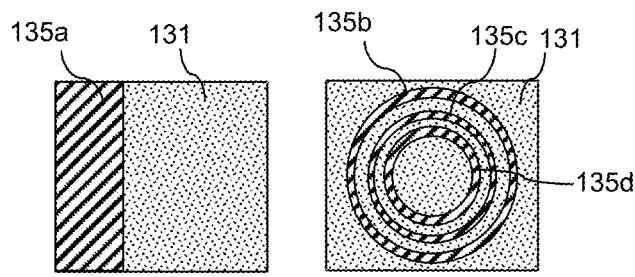
FIG. 5A depicts a schematic top view of an exemplary pattern to modify a baseline light source according to an embodiment.
FIG. 5B depicts a schematic top view of another exemplary pattern to modify a baseline light source according to an embodiment.

Principles of laser treatment can be applied to any kind of pc-devices (a pc-LEDs, a group of pc-LEDs, an assembly of pc-LEDs, a pixelated LED or micro-LED) in order to reduce either the pixel-to-pixel color spread, or pc-LED to pc-LED color spread, or device-to-device color spread. There is no limit to patterns of the laser treatment. Types of patterns may be chosen depending on desired color point distributions and final applications of the light sources. FIGS. 5A-5B depict schematic top views of an exemplary light source, including unmodified device material and laser-modified device material. FIG. 5A shows unmodified device material 131 and laser-modified device material 135a. The laser-modified device material 135a is a rectangular continuous surface section. FIG. 5B shows a series of concentric rings 135b, 135c, 135d, which are laser-treated, and primary down converter material 131 is untreated.

For illustration purposes, FIGS. 6-11 include 5 LEDs or pixels. The illustrated modified pixels correspond to those shown in FIG. 3. It is understood that any number of pixels and array size may be used, and that modification to LEDs or pixels is based on a baseline measurement to identify which LEDS or pixels are suitable for modification. Baseline measurements can be used to prepare baseline measurement graphs. Also for illustration purposes, laser-modification is shown as one section of ablation and one section of roughening per LED, but it is understood that the number of modified sections and type of modification (alation and/or roughening) is not limited and is determined based on the baseline measurement and end use.

Figure 6:
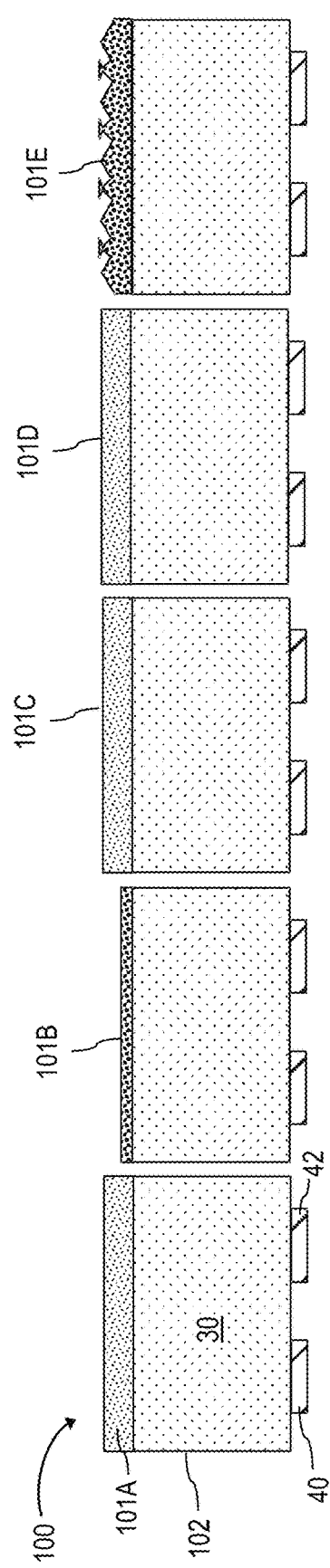
FIG. 6 is a schematic cross-sectional view of a light source comprising groups of light emitting diodes (LEDs) including primary and laser-modified down converter material in accordance with one or more embodiments.

FIG. 6 is a schematic cross-sectional view of a light source 100 comprising groups of light emitting diodes (LEDs) including primary and laser-modified down converter material in accordance with one or more embodiments. The light source 100 comprises a plurality of LEDs 102. Each LED 102 comprises an LED pump (which is a stack of semiconductor layers including an active region) 30 and contacts 40 and 42, one of which is an anode and one of which is a cathode. On each LED pump is a down converter (e.g., phosphor) material, collectively sections 101A-101E. The down converter material sections 101A, 101C, and 101D are primary down converter materials in that they are not laser-modified. The down converter material sections 101B and 101E include laser-modified down converter materials. Any amount or portion of the down converter material on the LED pump is laser-modified so long as some of the down converter material remains on the LED pump in that section to provide light conversion. In this embodiment, the down converter material of section 101B is an ablated material and the down converter material of section 101E is a roughened material. In this embodiment, the sections of down converter material 101A-101E are segmented layers on respective LEDs.

Figure 7:
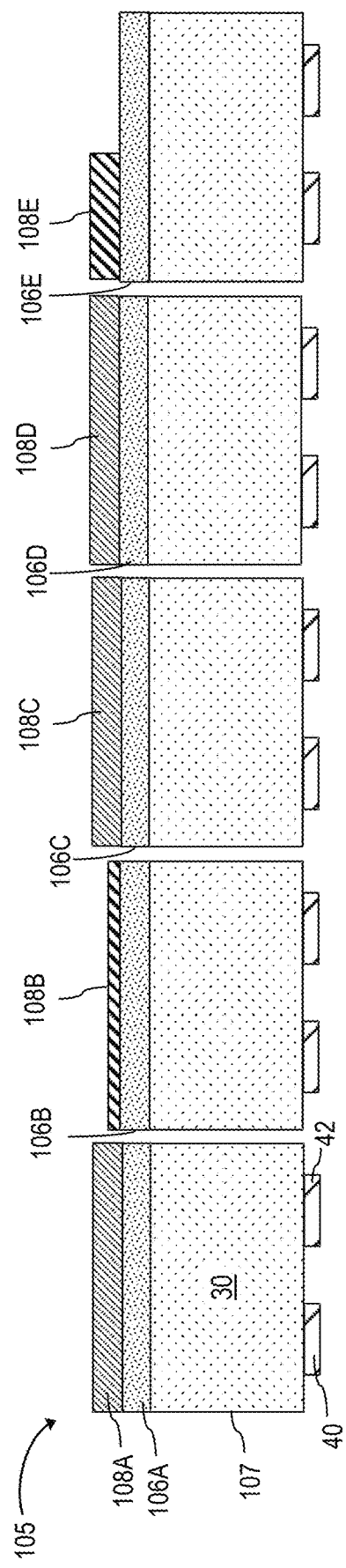
FIG. 7 is a schematic cross-sectional view of a light source comprising groups of light emitting diodes (LEDs) including primary and laser-modified functional material according to one or more embodiments.

FIG. 7 is a schematic cross-sectional view of a light source 105 comprising groups of LEDs including primary and laser-modified functional material according to one or more embodiments. The light source 105 comprises a plurality of LEDs 107. Each LED 107 comprises an LED pump (which is a stack of semiconductor layers including an active region) 30 and contacts 40 and 42, one of which is an anode and one of which is a cathode. On each LED pump is a down converter (e.g., phosphor) material, collectively sections 106A-106E. On the down converter material is a functional material, collectively sections 108A-108E on respective sections 106A-106E. The functional material sections 108A, 108C, and 108D are primary functional materials in that they are not laser-modified. The functional material sections 108B and 108E are laser-modified functional materials. In this embodiment, the functional material of section 108B is an ablated material that has a reduced thickness over the width of the section. In this embodiment, the functional material of section 108E is an ablated material that has a reduced width over the thickness of the section, which exposes the down converter material of section 106E. In this embodiment, the sections of functional material 108A-108E are segmented layers on respective LEDs.

Figure 8:
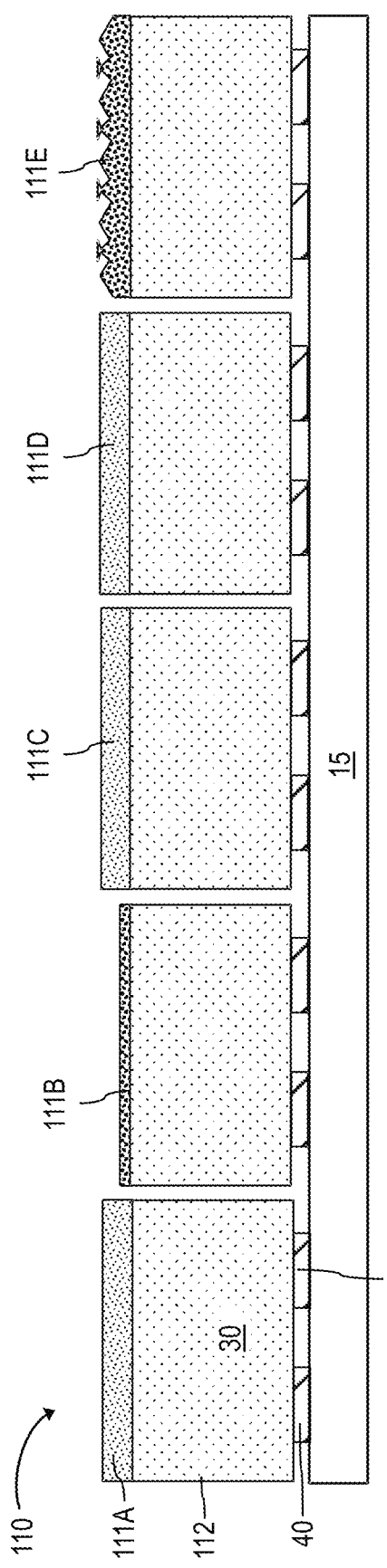
FIG. 8 is a schematic cross-sectional view of a light source comprising an array of light emitting diodes (LEDs) on a device substrate including primary and laser-modified down converter material in accordance with one or more embodiments.

FIG. 8 is a schematic cross-sectional view of a light source 110 comprising an array of LEDs on a device substrate including primary and laser-modified down converter material in accordance with one or more embodiments. The light source 110 comprises a plurality of LEDs 112. Each LED 112 comprises an LED pump (which is a stack of semiconductor layers including an active region) 30 and contacts 40 and 42, one of which is an anode and one of which is a cathode. On each LED pump is a down converter (e.g., phosphor) material, collectively sections 111A-111E. The LEDs are affixed to a device substrate 15 by the contacts 40 and 42. The down converter material sections 111A, 111C, and 111D are primary down converter materials in that they are not laser-modified. The down converter material sections 111B and 111E include laser-modified down converter materials. Any amount or portion of the down converter material on the LED pump is laser-modified so long as some of the down converter material remains on the LED pump in that section to provide light conversion. In this embodiment, the down converter material of section 111B is an ablated material and the down converter material of section 111E is a roughened material. In this embodiment, the sections of down converter material 111A-111E are segmented layers on respective LEDs.

Figure 9:
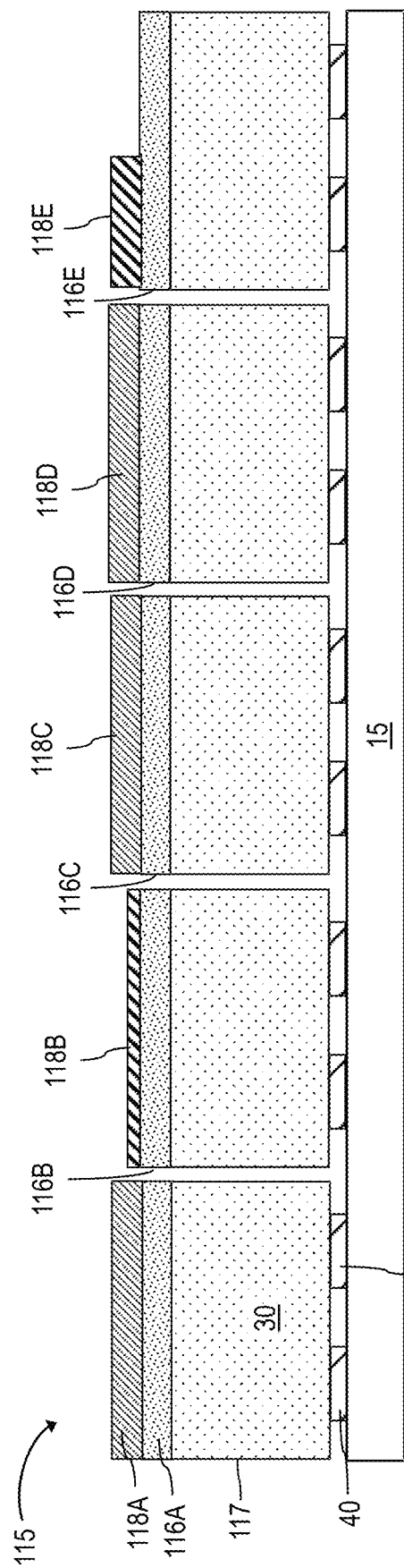
FIG. 9 is a schematic cross-sectional view of a light source comprising an array of light emitting diodes (LEDs) on a device substrate including primary and laser-modified functional material according to one or more embodiments.

FIG. 9 is a schematic cross-sectional view of a light source 115 comprising an array of LEDs on a device substrate including primary and laser-modified functional material according to one or more embodiments. The light source 115 comprises a plurality of LEDs 117. Each LED 117 comprises an LED pump (which is a stack of semiconductor layers including an active region) 30 and contacts 40 and 42, one of which is an anode and one of which is a cathode. On each LED pump is a down converter (e.g., phosphor) material, collectively sections 116A-116E. On the down converter material is a functional material, collectively sections 118A-118E on respective sections 116A-116E. The functional material sections 118A, 118C, and 118D are primary functional materials in that they are not laser-modified. The functional material sections 118B and 118E are laser-modified functional materials. In this embodiment, the functional material of section 118B is an ablated material that has a reduced thickness over the width of the section. In this embodiment, the functional material of section 118E is an ablated material that has a reduced width over the thickness of the section, which exposes the down converter material of section 116E. In this embodiment, the sections of functional material 118A-118E are segmented layers on respective LEDs.

FIG. 10 is a schematic cross-sectional view of a light source 120 comprising an array of uLEDs on a device substrate including primary and laser-modified down converter material in accordance with one or more embodiments. The light source 120 comprises a plurality of uLEDs 122. Each uLED 122 comprises a stack of semiconductor layers including an active region 32 and contacts 40 and 42, one of which is an anode and one of which is a cathode. On each uLED stack 32 is a down converter (e.g., phosphor) material, collectively sections 121A-121E. The uLEDs are affixed to a device substrate 15 by the contacts 40 and 42. The down converter material sections 121A, 121C, and 121D are primary down converter materials in that they are not laser-modified. The down converter material sections 121B and 121E include laser-modified down converter materials. Any amount or portion of the down converter material on the uLED stack is laser-modified so long as some of the down converter material remains on the uLED stack in that section to provide light conversion. In this embodiment, the down converter material of section 121B is an ablated material and the down converter material of section 121E is a roughened material. In this embodiment, the sections of down converter material 121A-121E are part of a continuous layer on all of the uLEDs.

FIG. 11 is a schematic cross-sectional view of a light source 125 comprising an array of uLEDs on a device substrate including primary and laser-modified functional material according to one or more embodiments. The light source 125 comprises a plurality of uLEDs 127. Each uLED 127 comprises a stack of semiconductor layers including an active region 32 and contacts 40 and 42, one of which is an anode and one of which is a cathode. On each uLED stack 32 is a down converter (e.g., phosphor) material, collectively sections 126A-126E. On the down converter material is a functional material, collectively sections 128A-128E on respective sections 126A-126E. The functional material sections 128A, 128C, and 128D are primary functional materials in that they are not laser-modified. The functional material sections 128B and 128E are laser-modified functional materials. In this embodiment, the functional material of section 128B is an ablated material that has a reduced thickness over the width of the section. In this embodiment, the functional material of section 128E is an ablated material that has a reduced width over the thickness of the section, which exposes the down converter material of section 126E. In this embodiment, the sections of functional material 128A-128E are part of a continuous layer on a continuous down converter material on respective LEDs.

With further regard to the laser treatment and near-field LED emission, patterning could be configured to produce a gradient or a specific pattern of an emission profile at the top of a down converter material. An exemplary down converter material is a polycrystalline ceramic plate of a phosphor material, e.g., a Lumiramic plate. The following metrics could potentially be patterned: color point (color over source), color over angle, flux, and radiation profile. The following embodiments can be used to achieve the patterning goals: patterned ablation of a surface of the down converter material; patterned roughening of a surface of the down converter material; patterning of a functional material or layer located above the down converter material; and offset platelet attach relative to the die. As to patterning, it is generally thought that the patterning will not extend through an entire thickness of the down converter layer. In one or more embodiments, patterning of the functional layer allows for surface patterning and/or patterning through an entire thickness of the functional material.

With respect to FIGS. 11A to 16B, variations of down-converter material and/or function material on an LED are shown. The LEDs in all of the figures comprise an LED pump 203 (which is a stack of semiconductor layers including an active region) and contacts 204 and 206, one of which is an anode and one of which is a cathode.

Figure 12:
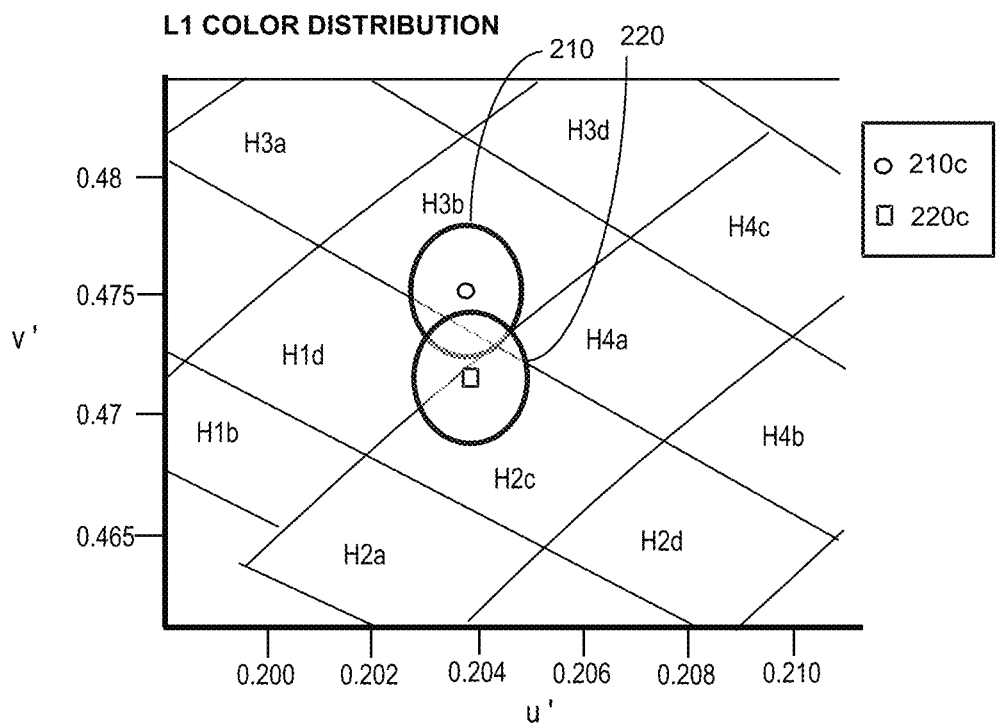
FIG. 12 provides an illustrative graph of color point distributions, each having a centroid for a baseline light source and a target or desired light source automotive color bins in a CIE 1976 color space.

FIG. 12 provides an illustrative graph of color point distributions of two light sources for automotive color bins in a CIE 1976 color space. A baseline light source generates color point distribution 210 having a centroid 210c in color bin "H3b". A target or desired light source generates color point distribution 220 having a centroid 220c in color bin "H2c". For illustration purposes, the first baseline light source needs modifying to reside in or at least closer to the "H2c" color bin. The baseline light source is thereafter laser-treated according to techniques herein.

Figure 13:
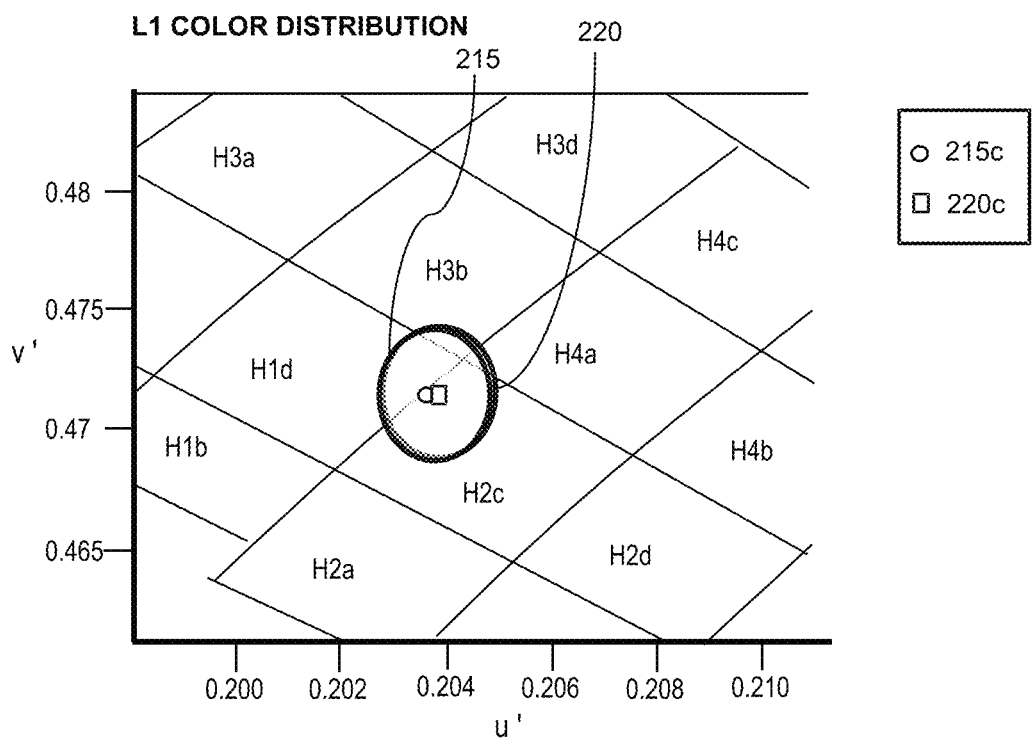
FIG. 13 provides an illustrative graph of color point distributions, each having a centroid for a tuned light source and the target or desired light source for automotive color bins in a CIE 1976 color space.

FIG. 13 provides an illustrative graph of color point distributions of two light sources for automotive color bins in a CIE 1976 color space. The baseline light source of FIG. 11 was laser-modified to yield a new color distribution 215 whose centroid 215c is closer to the "H2c" color bin, and likewise, to the centroid 220c of the target or desired light source. The color point distributions 210 and 220 of FIG. 12 are now substantially overlapping in FIG. 13. Patterning can advantageously achieve uniformize color over source, a tuned color response, and/or improve color targeting/yields. Ablation treatment may be one way to achieve this. Patterning can also advantageously target a radiation profile. For example, escape light angles can be modified in specific areas and therefore possibility for optics to collect more light of these specific areas. Roughening may be one way to achieve this.

Functional materials can include one or more of the following: a distributed Bragg reflector (DBR), a dichroic filter (DCF), a ceramic material, and a powdered phosphor layer.

Generally, modifying the DBR impacts flux. DBR can create a partially reflective mirror. A laser patterning would be effective to put less light at a specific spot on the road of a headlight application.

A DCF could be used as a partial mirror similar to DBR, or to correct color on angle on specific areas.

A ceramic material, for example, a multi-layer ceramic could be tape-casted which would be effective to have different compositions along z axis. Ablation patterning could enable color tuning along u' as well.

A powdered phosphor layer could be layered on top of a down converter material (e.g., a ceramic phosphor layer), for example with a film. In one or more embodiments, a red film may be layered, for example an ALD-bonded red layer. Patterning could be used for color tuning or projecting different color on specific areas.

Figure 14A:
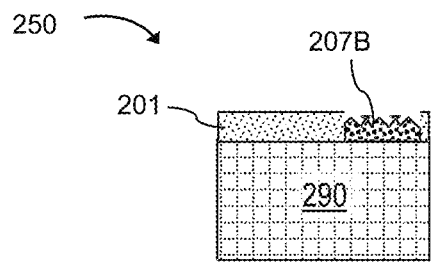
FIGS. 14A and 14B are cross-sectional views of a light source, comprising one or more light emitting diodes (LEDs) according to embodiments.

FIG. 14A is a cross-sectional views of an LED light source, which may include one or more pixels or LEDs, according to embodiments, and to which metal contacts would be added for further use. In FIG. 14A, the light source 250 includes a down converter material 201 on the one or more pixels and/or LEDs 290. Laser-modified section 207B of down converter material is included also. In this embodiment, the laser-modified section 207B is a roughened material. The roughened material yields changes the surface topology and/or three-dimensional shape of the phosphor layer, which results in an increase of scattering at the surface of the phosphor layer and therefore of additional passes of the primary light within the phosphor layer. This is comparable to an increase of the "effective" thickness of the phosphor layer and hence an increase of the primary light conversion (v' increase). In one or more embodiments, roughening alone of one or more pixels or LEDs is effective for color tuning.

Figure 14B:
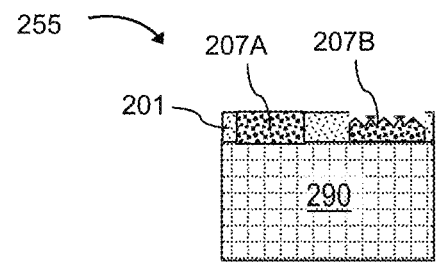

FIG. 14B is a cross-sectional views of an LED light source, which may include one or more pixels or LEDs, according to embodiments, and to which metal contacts would be added for further use. In FIG. 14B, the light source 255 includes the down converter material 201 on the one or more pixels and/or LEDs 290. Laser-modified sections 207A and 207B of down converter material are included also. In this embodiment, the laser-modified section 207A is an ablated material further to the laser-modified section 207B, which is a roughened material.

Figure 15A:
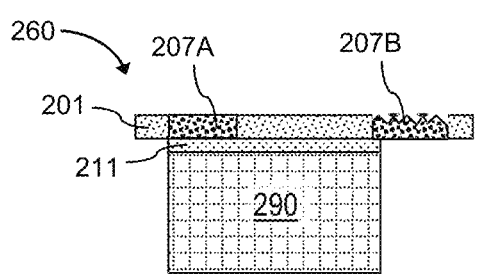
FIGS. 15A and 15B are schematic cross-sectional views of light sources, each comprising one or more light emitting diodes (LEDs) according to embodiments.
Figure 15B:
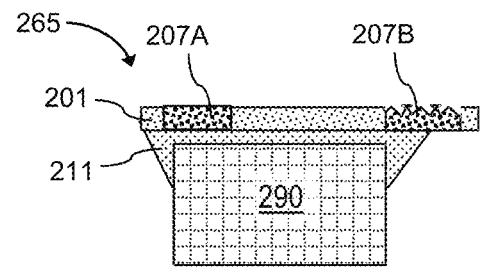

An offset of the down converter material, e.g., Lumiramic, can also create a gradient in flux/luminance over the emitting area. This can be combined with patterning options described herein. FIGS. 15A and 15B are schematic cross-sectional views light sources, each comprising one or more light emitting diodes (LEDs) according to embodiments, and to which metal contacts would be added for further use. In FIG. 15A, the light source 260 includes one or more pixels and/or of LEDs 290 on which a down converter material 201 is off-set and affixed by a layer of adhesive 211. Laser-modified sections 207A and 207B of down converter material are included also. In this embodiment, the down converter material of section 207A is an ablated material and the down converter material of section 207B is a roughened material. In FIG. 15B, the light source 265 includes the down converter material 201 off-set on the one or more pixels and/or LEDs 290 and affixed by a layer of adhesive 211, which further includes glue wings 212. Analogous to FIG. 15A, the laser treated down converter material of section 207A is an ablated material, and the laser treated down converter material of section 207B is a roughened material.

Figure 16A:
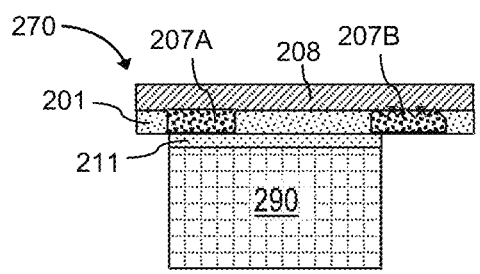
FIGS. 16A and 16B are schematic cross-sectional views of light sources, each comprising one or more light emitting diodes (LEDs) according to embodiments.
Figure 16B:
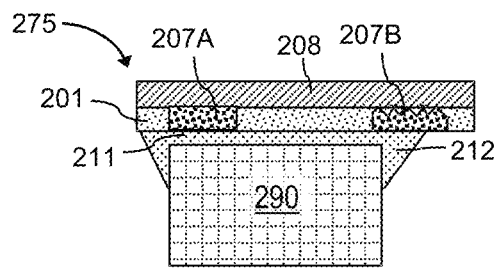

FIGS. 16A and 16B are schematic cross-sectional views light sources, each comprising one or more light emitting diodes (LEDs) according to embodiments, and to which metal contacts would be added for further use. In FIG. 16A, the light source 270 includes one or more pixels and/or of LEDs 290 on which a down converter material 201 is off-set and affixed by a layer of adhesive 211. Laser-modified sections 207A and 207B of down converter material are included also. A functional material 208 is on the down converter material and laser-modified sections. In this embodiment, the down converter material of section 207A is an ablated material and the down converter material of section 207B is a roughened material. In FIG. 16B, the light source 275 includes the down converter material 201 off-set on the one or more pixels and/or LEDs 290 and affixed by a layer of adhesive 211, which further includes glue wings 212. Analogous to FIG. 16A, the laser treated down converter material of section 207A is an ablated material, and the laser treated down converter material of section 207B is a roughened material. A functional material 208 is on the down converter material and laser-modified sections.

Figure 17:
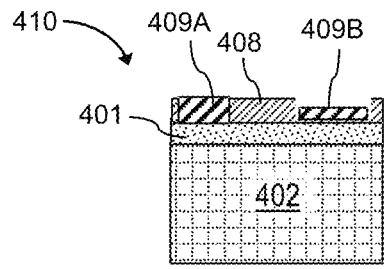
FIG. 17 is a schematic cross-sectional views of a light source, comprising one or more light emitting diodes (LEDs) according to embodiments.

FIG. 17 is a cross-sectional views of an LED light source, which may include one or more pixels or LEDs, according to embodiments, and to which metal contacts would be added for further use. In FIG. 17, the light source 410 includes a functional material 408 on a down converter material 401 on the one or more pixels and/or LEDs 402. Laser-modified sections 409A and 409B of functional material are included also. In this embodiment, the functional material of sections 409A and 409B are an ablated material. The laser-modified functional material 409A is modified through a thickness of the material. The laser-modified functional material 409B is modified over a width of the material.

Figure 18A:
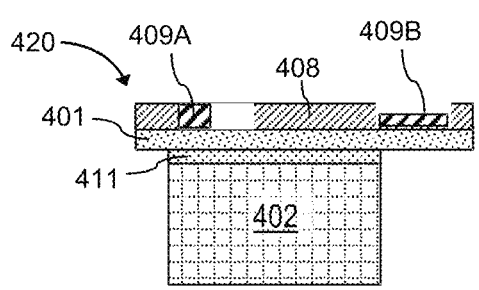
FIGS. 18A and 18B are schematic cross-sectional views of a light source, each comprising one or more light emitting diodes (LEDs) according to embodiments.
Figure 18B:
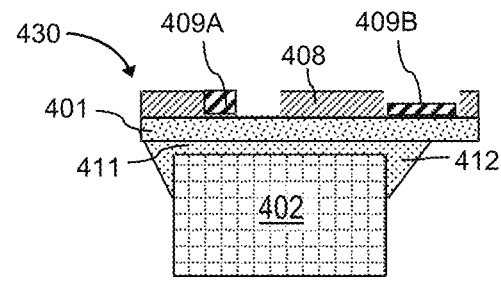

FIGS. 18A and 18B are schematic cross-sectional views of an LED light source, which may include one or more pixels or LEDs, according to embodiments, and to which metal contacts would be added for further use. In FIG. 18A, the light source 420 includes a functional material 408 on the down converter material 401, both of which are off-set on the one or more pixels and/or LEDs 402, the down converter material 401 affixed by a layer of adhesive 411 to the one or more pixels and/or LEDs 402. Laser-modified sections 409A and 409B of functional material are included also. In this embodiment, the functional material of sections 409A and 409B are an ablated material. The laser-modified functional material 409A is modified through a thickness of the material. The laser-modified functional material 409B is modified over a width of the material. In FIG. 18B, the light source 430 includes the functional material 408 and the down converter material 401, both of which are off-set on the one or more pixels and/or LEDs 402, and the down converter material 401 affixed by a layer of adhesive 411, which further includes glue wings 412. Analogous to FIG. 18A, the laser treated functional material of sections 409A and 409B are an ablated material. Similarly, the laser-modified functional material 409A is modified through a thickness of the material. The laser-modified functional material 409B is modified over a width of the material.

Figure 19:
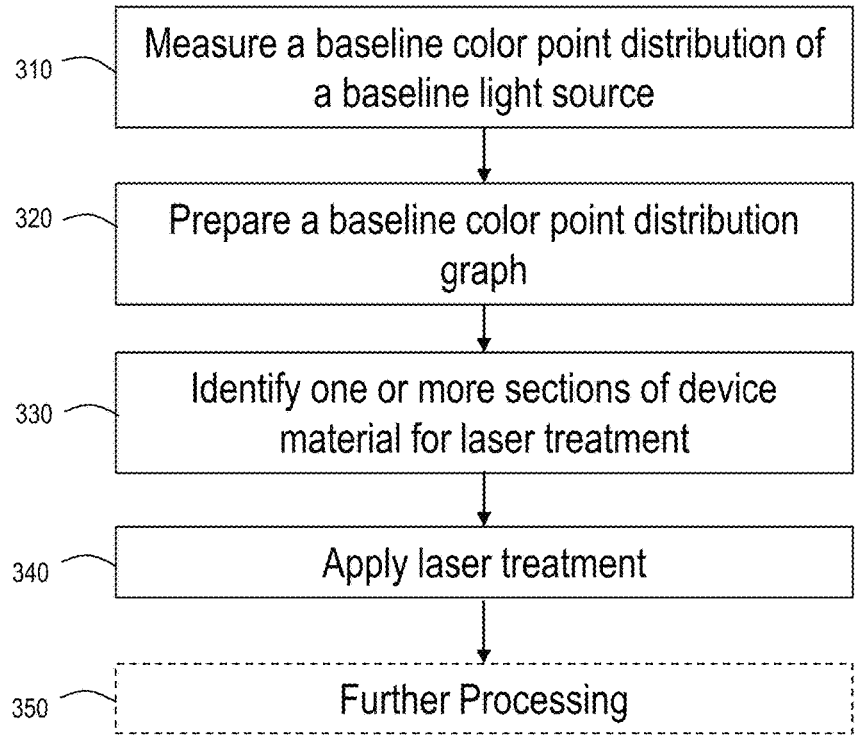
FIG. 19 is a process flow diagram of a method of making a light source according to one or more embodiments.

FIG. 19 provides a process flow diagram 300 for manufacture of a light source according to one or more embodiments. At operation 310, a baseline color point distribution of a baseline light source is measured. At operation 320, a baseline color point distribution is prepared. The baseline color point distribution is analyzed to determine what if any adjustments to the baseline light source is needed. For example, deviation from a tuned color point distribution would warrant adjustments to the baseline light source. At operation 330, one or more sections of device material are identified for laser treatment. The device material is assessable by a laser for processing. Device material includes but is not limited to down material, e.g., a phosphor layer, or a functional material.

At operation 340, laser treatment is applied to portions of surface(s) of the device material. As discussed herein, suitable laser treatments may include use of a femtosecond laser. In one or more embodiments, the irradiation is done either in ablation mode (to decrease v') or in roughening mode (to increase v'). Femtosecond laser irradiation has a sufficient spatial resolution (micrometer scale) and irradiance control to tune color point within the needed accuracy.

At operation 350, optional further post-processing is performed. In one or more embodiments, further processing including formation of a passivation layer around a portion or the entirety of a LED or a uLED or the device as a whole. In one or more embodiments, the processed structure retains a substrate, is singulated, and is further processed. In one or more embodiments, the processed structure is flipped and affixed to a support, for example, a tape support, and the substrate is removed. Removal of the substrate is in accordance with methods known in the art including substrate laser liftoff. Upon removal of the substrate, singulated LEDs or uLEDs are created.

In some embodiments, LED devices herein are further processed to include optical elements such as lenses, metalenses, and/or pre-collimators. Optical elements can also or alternatively include apertures, filters, a Fresnel lens, a convex lens, a concave lens, or any other suitable optical element that affects the projected light from the light emitting array. Additionally, one or more of the optical elements can have one or more coatings, including UV blocking or anti-reflective coatings. In some embodiments, optics can be used to correct or minimize two- or three-dimensional optical errors including pincushion distortion, barrel distortion, longitudinal chromatic aberration, spherical aberration, chromatic aberration, field curvature, astigmatism, or any other type of optical error. In some embodiments, optical elements can be used to magnify and/or correct images. Advantageously, in some embodiments magnification of display images allows the light emitting array to be physically smaller, of less weight, and require less power than larger displays. Additionally, magnification can increase a field of view of the displayed content allowing display presentation equals a user's normal field of view.

APPLICATIONS

Figure 20:
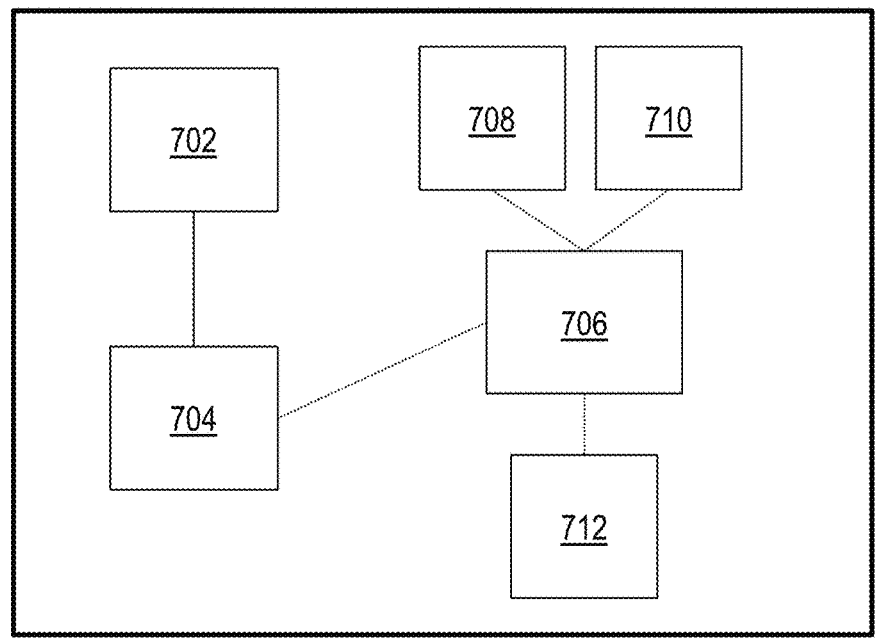
FIG. 20 schematically illustrates an exemplary illumination system comprising LEDs according to embodiments herein.

FIG. 20 schematically illustrates an exemplary headlight illumination system 700 utilizing LEDs disclosed herein. The headlight illumination system 700 comprises an LED illumination array and lens system 702 in electrical communication with an LED driver 704. The headlight illumination system 700 also comprises a controller 706, such as a microprocessor. The controller 706 is coupled to the LED driver 704. The controller 706 may also be coupled to one or more auxiliary components 708 and sensors 710 associated with the headlights, and operate in accordance with instructions and profiles stored in memory 712.

Sensors 710 may include, for example, positional sensors (e.g., a gyroscope and/or accelerometer) and/or other sensors that may be used to determine the position, speed, and orientation of system 700. The signals from the sensors 710 may be supplied to the controller 706 to be used to determine the appropriate course of action of the controller 706 (e.g., which LEDs are currently illuminating a target and which LEDs will be illuminating the target a predetermined amount of time later).

In operation, illumination from some or all of the pixels of the LED array in 702 may be adjusted—deactivated, operated at full intensity, or operated at an intermediate intensity. As noted above, beam focus or steering of light emitted by the LED array in 702 can be performed electronically by activating one or more subsets of the pixels, to permit dynamic adjustment of the beam shape without moving optics or changing the focus of the lens in the lighting apparatus.

LED illumination arrays and lens systems such as described herein may support various other beam steering or other applications that benefit from fine-grained intensity, spatial, and temporal control of light distribution. These applications may include, but are not limited to, precise spatial patterning of emitted light from pixel blocks or individual pixels. Depending on the application, emitted light may be spectrally distinct, adaptive over time, and/or environmentally responsive. The light emitting pixel arrays may provide pre-programmed light distribution in various intensity, spatial, or temporal patterns. Associated optics may be distinct at a pixel, pixel block, or device level. An example light emitting pixel array may include a device having a commonly controlled central block of high intensity pixels with an associated common optic, whereas edge pixels may have individual optics. In addition to flashlights, common applications supported by light emitting pixel arrays include video lighting, camera flashes, architectural and area illumination, and street lighting.

In some embodiments, each LED device in a light source array can be separately controlled, while in other embodiments groups of LEDs can be controlled as a block. In still other embodiments, both single LEDs and groups of LEDs can be controlled. To reduce overall data management requirements, control can be limited to on/off functionality or switching between relatively few light intensity levels. In other embodiments, continuous changes in lighting intensity are supported. Both individual and group level control of light intensity is contemplated. In one embodiment, overlapping or dynamically selected zones of control are also possible, with for example, overlapping groups of light emitters in the array being separately controllable despite having common LEDs depending on lighting requirements. In one embodiment, intensity can be separately controlled and adjusted by setting appropriate ramp times and pulse width for each LED using a pulse width modulation. This allows staging of LED activation to reduce power fluctuations, and to provide superior luminous intensity control.

Programmable light emitting arrays such as disclosed herein may also support a wide range of applications that benefit from fine-grained intensity, spatial, and temporal control of light distribution. This may include, but is not limited to, precise spatial patterning of emitted light from blocks or individual LEDs. Depending on the application, emitted light may be spectrally distinct, adaptive over time, and/or environmentally responsive. In some embodiments, the light emitting arrays may provide pre-programmed light distribution in various intensity, spatial, or temporal patterns. The emitted light may be based at least in part on received sensor data and may be used for optical wireless communications. Associated optics may be distinct at single or multiple LED level. An example light emitting array may include a device having a commonly controlled central block of high intensity LEDS with an associated common optic, whereas edge positioned LEDs may have individual optics. Common applications supported by light emitting LED arrays include camera or video lighting, architectural and area illumination, and street lighting.

Programmable light emitting arrays may be used to selectively and adaptively illuminate buildings or areas for improved visual display or to reduce lighting costs. In addition, light emitting arrays may be used to project media facades for decorative motion or video effects. In conjunction with tracking sensors and/or cameras, selective illumination of areas around pedestrians may be possible. Spectrally distinct LEDs may be used to adjust the color temperature of lighting, as well as support wavelength specific horticultural illumination.

Street lighting is an important application that may greatly benefit from use of programmable light emitting arrays. A single type of light emitting array may be used to mimic various street light types, allowing, for example, switching between a Type I linear street light and a Type IV semicircular street light by appropriate activation or deactivation of selected LEDs. In addition, street lighting costs may be lowered by adjusting light beam intensity or distribution according to environmental conditions or time of use. For example, light intensity and area of distribution may be reduced when pedestrians are not present. If LEDs are spectrally distinct, the color temperature of the light may be adjusted according to respective daylight, twilight, or night conditions.

Programmable light emitting LEDs are also well suited for supporting applications requiring direct or projected displays. For example, automotive headlights requiring calibration, or warning, emergency, or informational signs may all be displayed or projected using light emitting arrays. This allows, for example, modifying directionality of light output from a automotive headlight. If a light emitting array is composed of a large number of LEDs or includes a suitable dynamic light mask, textual or numerical information may be presented with user guided placement. Directional arrows or similar indicators may also be provided.

EMBODIMENTS

Various embodiments are listed below. It will be understood that the embodiments listed below may be combined with all aspects and other embodiments in accordance with the scope of the invention.

Embodiment (a). A light source comprising: a plurality of light emitting diodes (LEDs); a plurality of sections of a primary down converter material corresponding to a first plurality of the LEDs; and one or more sections of a laser-modified down converter material corresponding to a second plurality of the LEDs; a light blocking layer positioned between all of the LEDs; and a tuned color point distribution of the light source as a whole.

Embodiment (b). The light source of embodiment (a), wherein the plurality of sections of a primary down converter material and the one or more sections of the laser-modified down converter material are segmented layers on respective LEDs.

Embodiment (c). The light source of embodiment (a) or (b), wherein one or more of the segmented layers of the plurality of sections of the primary down converter material and the one or more sections of the laser-modified down converter material are off-set from center on the respective LED.

Embodiment (d). The light source of any of embodiments (a) to (c), wherein a continuous down converter layer on all of the LEDs comprises the plurality of sections of the primary down converter material and the one or more sections of the laser-modified down converter material.

Embodiment (e). The light source of any of embodiments (a) to (d), wherein the one or more sections of the laser-modified down converter material was modified upon measurement of a baseline color point distribution of a baseline light source comprising a plurality of light emitting diodes in the absence of any sections of the laser-modified down converter material in order to achieve the tuned color point distribution.

Embodiment (f). The light source of any of embodiments (a) to (e), wherein the tuned color point distribution has a lower standard deviation as compared to a baseline color point distribution of a baseline light source comprising a plurality of light emitting diodes in the absence of any sections of the laser-modified down converter material.

Embodiment (g). The light source of embodiment 1, wherein a centroid of the tuned color point distribution differs from a centroid of a baseline light source comprising a plurality of light emitting diodes in the absence of any sections of the laser-modified down converter material.

Embodiment (h). The light source of any of embodiments (a) to (g), wherein the one or more sections of the laser-modified down converter material comprise relative to the primary down converter material: a thickness reduction and/or a surface topography change and/or three-dimensional shaping for light emission tunability.

Embodiment (i). A light source comprising: a monolithic body comprising: a plurality of micro-light emitting diodes (uLEDs), each of the uLEDs having at least one characteristic dimension of greater than or equal to 1 micrometer less than or equal to 300 micrometers, the characteristic dimension being selected from the group consisting of: height, width, depth, thickness, and combinations thereof; a continuous down converter layer on all of the uLEDS comprising a plurality of sections of a primary down converter material corresponding to a first plurality of the uLEDs, and one or more sections of a laser-modified down converter material corresponding to a second plurality of the uLEDs, the one or more sections of the laser-modified down converter material comprising relative to the primary down converter material: a thickness reduction and/or a surface topography change and/or three-dimensional shaping for light emission tunability; a light blocking layer positioned between all of the uLEDs; and a tuned color point distribution of the light source as a whole.

Embodiment (j). The light source of embodiment (i), wherein the one or more sections of the laser-modified down converter material was modified upon measurement of a baseline color point distribution of a baseline light source comprising a plurality of micro-light emitting diodes in the absence of any sections of the laser-modified down converter material in order to achieve the tuned color point distribution.

Embodiment (k). The light source of embodiment (i) or (j), wherein the tuned color point distribution has a lower standard deviation as compared to a baseline color point distribution of a baseline light source comprising a plurality of micro-light emitting diodes in in the absence of any sections of the laser-modified down converter material.

Embodiment (l). The light source of any of embodiments (i) to (k), wherein the tuned color point distribution has a centroid of the tuned color distribution that differs from a centroid of a baseline color distribution of a baseline light source comprising a plurality of micro-light emitting diodes in in the absence of any sections of the laser-modified down converter material.

Embodiment (m). The light source of any of embodiments (i) to (l) further comprising a functional material on the continuous down converter layer.

Embodiment (n). A method of manufacturing a light source comprising a plurality of light emitters comprising: measuring a baseline color point distribution of a baseline light source comprising a plurality of light emitting diodes (LEDs), and a primary down converter material in the absence of any laser-modified down converter material; preparing a baseline color point distribution graph; identifying one or more sections of the primary down converter material whose corresponding LEDs contribute to deviating from a tuned color point distribution; and applying a laser treatment to the one or more sections of the primary down converter material whose corresponding LEDs contribute to deviating from the tuned color point distribution to prepare one or more sections of a laser-modified down converter material, and thereby prepare a light source having the tuned color point distribution.

Embodiment (o). The method of embodiment (n) comprising: identifying one or more highest and/or lowest quantiles of the baseline color point distribution; identifying one or more of the LEDs as generators of the one or more highest and/or lowest quantiles of the baseline color point distribution; applying the laser treatment to the sections of primary down converter material corresponding to the one or more of the LEDs that are generators of the one or more highest and/or lowest quantiles of the baseline color point distribution.

Embodiment (p). The method of embodiment (n) or (o), wherein the tuned color point distribution has a lower standard deviation as compared to the baseline color point distribution.

Embodiment (q). The method of any of embodiments (n) to (p), wherein a centroid of the tuned color point distribution differs from a centroid of a baseline color point distribution.

Embodiment (r). The method of any of embodiments (n) to (q), wherein the laser treatment comprises femtosecond laser irradiation.

Embodiment (s). The method of any of embodiments (n) to (r), wherein each of the LEDs has at least one characteristic dimension of greater than or equal to 1 micrometer less than or equal to 300 micrometers, the characteristic dimension being selected from the group consisting of: height, width, depth, thickness, and combinations thereof.

Embodiment (t). The method of any of embodiments (n) to (s), wherein the laser treatment comprises ablation for thickness reduction and/or roughening for a surface topography change and/or three-dimensional shaping for light emission tunability.

Embodiment (u). Any foregoing embodiments (a) to (t), wherein the LEDs are mounted on submount.

Embodiment (v). Any foregoing embodiments (a) to (u), wherein the LEDs are integral to a monolithic body.

Embodiment (w). Any foregoing embodiments (a) to (v), wherein the primary down converter material comprises a polycrystalline ceramic plate of a phosphor material.

Embodiment (x). Any light source or method of the foregoing embodiments, wherein the phosphor material comprises a Ce(III)-doped garnet material (($M^I_{1-x-y}M^{II}_x M^{III}_y)_3(Al_{1-z}M^{IV}_z)_5O_{12}$ with $M^I$=(Y, Lu); $M^{II}$=(Gd, La, Yb); $M^{III}$=(Tb, Pr, Ce, Er, Nd, Eu) and $M^{IV}$=(Gd, Sc) with $0<x<1$; $0<y\leq1$; and $0<z<1$), or a Ce(III) and/or Eu(II) doped nitridosilicate ($M_2Si_5N_8$), or an oxonitridosilicate material ($MSi_2O_2N_2$) (M=alkaline earth)).

Embodiment (y). Any light source or method of embodiments (a) to (x), wherein the light source is effective to meet a first region in CIE 1931 color space, the first region being a polygon with (x, y) vertices of (0.31, 0.348), (0.453, 0.44), (0.5,0.44), (0.5, 0.38), (0.44, 0.38), and (0.31, 0.283).

Embodiment (z). Any foregoing light source or method of embodiments (a) to (y), wherein the LED or uLED comprises a stack of semiconductor layers including an active region.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims. It is also understood that other embodiments of this invention may be practiced in the absence of an element/step not specifically disclosed herein.

What is claimed is:

1. A light source comprising:
   a plurality of light emitting diodes (LEDs);
   a plurality of sections of a primary down converter material corresponding to a first plurality of the LEDs; and
   one or more sections of a laser-modified down converter material corresponding to a second plurality of the LEDs;
   a light blocking layer positioned between all of the LEDs; and
   a tuned color point distribution of the light source as a whole,
   wherein the plurality of sections of a primary down converter material and the one or more sections of the laser-modified down converter material are segmented layers on respective LEDs that are off-set from center on the respective LED.

2. The light source of claim 1, wherein a continuous down converter layer on all of the LEDs comprises the plurality of sections of the primary down converter material and the one or more sections of the laser-modified down converter material.

3. The light source of claim 1, wherein the one or more sections of the laser-modified down converter material was modified upon measurement of a baseline color point distribution of a baseline light source comprising a plurality of light emitting diodes in the absence of any sections of the laser-modified down converter material in order to achieve the tuned color point distribution.

4. The light source of claim 1, wherein the tuned color point distribution has a lower standard deviation as compared to a baseline color point distribution of a baseline light source comprising a plurality of light emitting diodes in the absence of any sections of the laser-modified down converter material.

5. The light source of claim 1, wherein a centroid of the tuned color point distribution differs from a centroid of a baseline light source comprising a plurality of light emitting diodes in the absence of any sections of the laser-modified down converter material.

6. The light source of claim 1, wherein the one or more sections of the laser-modified down converter material comprise relative to the primary down converter material: a thickness reduction and/or a surface topography change and/or three-dimensional shaping for light emission tunability.

7. A light source comprising:
   a monolithic body comprising: a plurality of micro-light emitting diodes (uLEDs), each of the uLEDs having at least one characteristic dimension of greater than or equal to 1 micrometer less than or equal to 300 micrometers, the characteristic dimension being selected from the group consisting of: height, width, depth, thickness, and combinations thereof;
   a continuous down converter layer on all of the uLEDS comprising a plurality of sections of a primary down converter material corresponding to a first plurality of the uLEDs, and one or more sections of a laser-modified down converter material corresponding to a second plurality of the uLEDs, the one or more sections of the laser-modified down converter material comprising relative to the primary down converter material: a thickness reduction and/or a surface topography change and/or three-dimensional shaping for light emission tunability;
   a light blocking layer positioned between all of the uLEDs; and
   a tuned color point distribution of the light source as a whole.

8. The light source of claim 7, wherein the one or more sections of the laser-modified down converter material was modified upon measurement of a baseline color point distribution of a baseline light source comprising a plurality of micro-light emitting diodes in the absence of any sections of the laser-modified down converter material in order to achieve the tuned color point distribution.

9. The light source of claim 7, wherein the tuned color point distribution has a lower standard deviation as compared to a baseline color point distribution of a baseline light source comprising a plurality of micro-light emitting diodes in in the absence of any sections of the laser-modified down converter material.

10. The light source of claim 7, wherein the tuned color point distribution has a centroid of the tuned color distribution that differs from a centroid of a baseline color distribution of a baseline light source comprising a plurality of micro-light emitting diodes in in the absence of any sections of the laser-modified down converter material.

11. The light source of claim 7 further comprising a functional material on the continuous down converter layer.

12. A method of manufacturing a light source comprising a plurality of light emitters comprising:
   measuring a baseline color point distribution of a baseline light source comprising a plurality of light emitting diodes (LEDs), and a primary down converter material in the absence of any laser-modified down converter material;
   preparing a baseline color point distribution graph;
   identifying one or more sections of the primary down converter material whose corresponding LEDs contribute to deviating from a tuned color point distribution; and
   applying a laser treatment to the one or more sections of the primary down converter material whose corresponding LEDs contribute to deviating from the tuned color point distribution to prepare one or more sections of a laser-modified down converter material, and thereby prepare a light source having the tuned color point distribution.

13. The method of claim 12 comprising: identifying one or more highest and/or lowest quantiles of the baseline color point distribution; identifying one or more of the LEDs as generators of the one or more highest and/or lowest quantiles of the baseline color point distribution; applying the laser treatment to the sections of primary down converter material corresponding to the one or more of the LEDs that are generators of the one or more highest and/or lowest quantiles of the baseline color point distribution.

14. The method of claim 12, wherein the tuned color point distribution has a lower standard deviation as compared to the baseline color point distribution.

15. The method of claim 12, wherein a centroid of the tuned color point distribution differs from a centroid of a baseline color point distribution.

16. The method of claim 12, wherein the laser treatment comprises femtosecond laser irradiation.

17. The method of claim 12, wherein each of the LEDs has at least one characteristic dimension of greater than or equal to 1 micrometer less than or equal to 300 micrometers, the characteristic dimension being selected from the group consisting of: height, width, depth, thickness, and combinations thereof.

18. The method of claim 12, wherein the laser treatment comprises ablation for thickness reduction and/or roughening for a surface topography change and/or three-dimensional shaping for light emission tunability.

* * * * *